United States Patent [19]

Konishi et al.

[11] Patent Number: 5,097,440

[45] Date of Patent: Mar. 17, 1992

[54] SEMICONDUCTOR MEMORY DEVICE COMPRISING A PLURALITY OF MEMORY ARRAYS WITH IMPROVED PERIPHERAL CIRCUIT LOCATION AND INTERCONNECTION ARRANGEMENT

[75] Inventors: Yasuhiro Konishi; Masaki Kumanoya; Katsumi Dosaka; Takahiro Komatsu; Yoshinori Inoue, all of Hyogo, Japan

[73] Assignee: Mitsubishi Denki Kabushiki Kaisha, Tokyo, Japan

[21] Appl. No.: 437,867

[22] Filed: Nov. 17, 1989

[30] Foreign Application Priority Data

Dec. 6, 1988 [JP] Japan .................. 63-309236

[51] Int. Cl.$^5$ .............. G11C 5/02; G11C 5/04; G11C 27/10
[52] U.S. Cl. ...................... 365/51; 365/63; 357/45
[58] Field of Search ............ 365/51, 63, 189.08, 365/230.03, 230.06; 357/45

[56] References Cited

U.S. PATENT DOCUMENTS

| | | | |
|---|---|---|---|
| 4,635,233 | 1/1987 | Matsumoto et al. | 365/230.03 |
| 4,660,174 | 4/1987 | Takemae et al. | 365/63 |
| 4,779,227 | 10/1988 | Kurafuji et al. | 365/51 |
| 4,849,943 | 7/1989 | Pfennings | 365/230.06 |

FOREIGN PATENT DOCUMENTS

| | | | |
|---|---|---|---|
| 0037227 | 3/1981 | European Pat. Off. | |
| 62-180594 | 8/1987 | Japan . | |
| 0188363 | 8/1987 | Japan | 357/45 |
| 63-39196 | 2/1988 | Japan . | |
| 0291460 | 11/1988 | Japan | 357/45 |
| 0010820 | 1/1990 | Japan | 357/45 |

OTHER PUBLICATIONS

Kiyoto Ohta et al., "A 1-Mbit Dram with 33-MHz Serial I/O Ports", *IEEE Journal of Solid-State Circuits*, vol. SC-21, No. 5, Oct. 1986, pp. 649-654.

Kimura et al., "Power Reduction Techniques in Megabit DRAMs", IEEE Journal of solid-State Circuits, vol. SC-21, No. 3, Jun. '86.

*Primary Examiner*—Stuart N. Hecker
*Assistant Examiner*—Jack A. Lane
*Attorney, Agent, or Firm*—Lowe, Price, LeBlanc & Becker

[57] ABSTRACT

A semiconductor memory device comprises eight memory arrays (b 10a, 10b) arranged in one column. A peripheral circuit (60) is arranged in the central portion of the eight memory arrays (10a, 10b), two column decoders (51, 52) being arranged with the peripheral circuit (60) interposed therebetween. Each of the eight memory arrays (10a, 10b) is provided with a row decoder (20). A plurality of first column selecting lines (CL1) are provided so as to cross the three memory arrays (10a, 10b) arranged on one side of the peripheral circuit (60) from the column decoder (51). In addition, a plurality of second column selecting lines (CL2) are provided so as to intersect with the three memory arrays (10a, 10b) arranged on the other side of the peripheral circuit (60) from the column decoder (52).

5 Claims, 14 Drawing Sheets

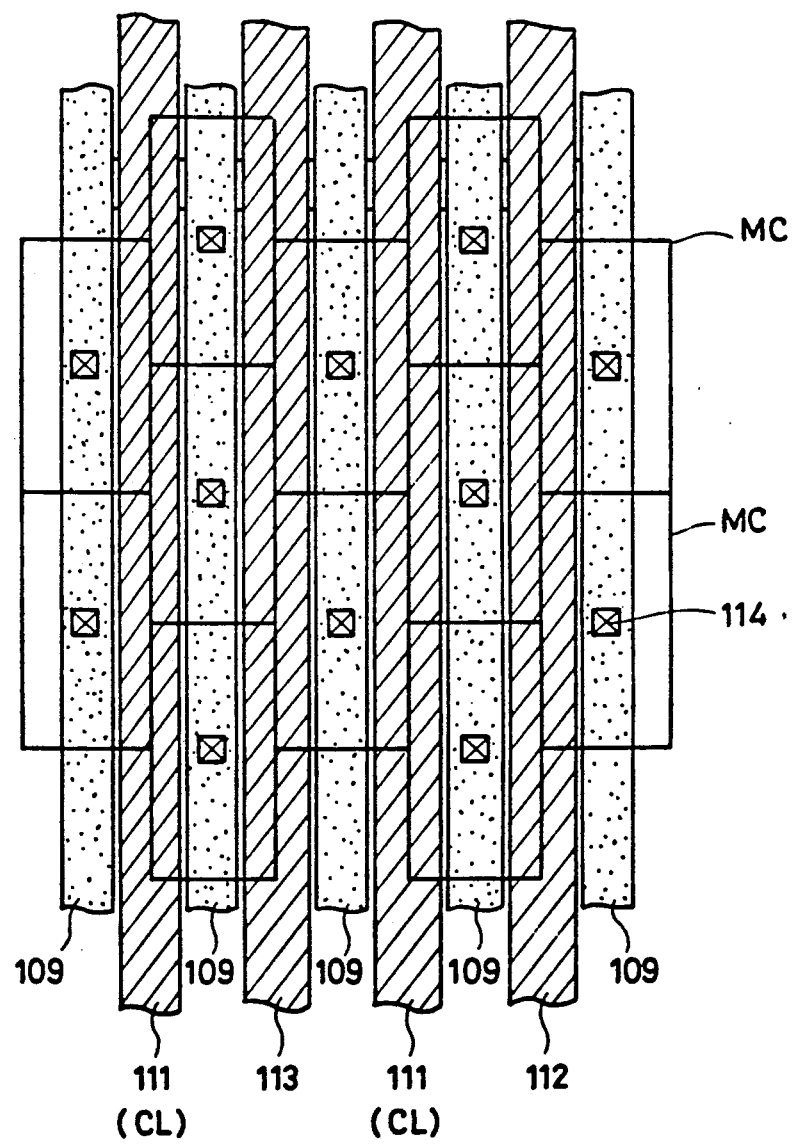

SEMICONDUCTOR MEMORY DEVICE COMPRISING A PLURALITY OF MEMORY ARRAYS WITH IMPROVED PERIPHERAL CIRCUIT LOCATION AND INTERCONNECTION ARRANGEMENT

CROSS-REFERENCE TO RELATED APPLICATION

The present application is related to copending application Ser. No. 07/437,874 to Yasuhiro Konishi, Masaki Kumanoya, Katsumi Dosaka, Takahiro Komatsu and Yoshinori Inoue, filed currently herewith and filed commonly assigned with the present application.

BACKGROUND OF THE INVENTION

1. Field of the Invention

The present invention relates generally to semiconductor memory devices, and more particularly, to a semiconductor memory device comprising a plurality of memory arrays.

2. Description of the Background Art

FIG. 7 is a circuit diagram showing a structure of a main part of a general dynamic random access memory (referred to as DRAM hereinafter).

In FIG. 7, in a memory array 10, a plurality of word lines WL0 to WLi and a plurality of bit line pairs B0 and $\overline{B0}$ to Bj and $\overline{Bj}$ are arranged intersecting with each other, memory cells MC being provided at intersections thereof. More specifically, a plurality of memory cells MC are arranged in a matrix. Each of the bit line pairs B0 and $\overline{B0}$ to Bj and $\overline{Bj}$ is connected to an input/output line pair I/O and $\overline{I/O}$ through an I/O gate comprising transistors Q1 and Q2. In addition, a sense amplifier SA is connected to each of the bit line pairs B0 and $\overline{B0}$ to Bj and $\overline{Bj}$. A plurality of sense amplifiers SA constitute a sense amplifier portion 30, and a plurality of I/O gates constitute an I/O gate portion 40.

An X decoder 20 is responsive to an externally applied X address signal for selecting one of the word lines WL0 to WLi to raise a potential on the word line. Consequently, information charges stored in a plurality of memory cells MC connected to the selected word line are read out to corresponding bit lines as data. As a result, there occurs a very small potential difference between two bit lines constituting each of the bit line pairs. This very small potential difference is amplified by a corresponding sense amplifier SA. On the other hand, a Y decoder 50 is responsive to an externally applied Y address signal for selecting one bit line pair to apply a column selecting signal to a corresponding I/O gate through a column selecting line CL. Consequently, the selected bit line pair is connected to the input/output line pair I/O and $\overline{I/O}$. As a result, data is read out to the input/output line pair I/O and $\overline{I/O}$. The data is outputted to an external output pin through a circuit of the output system (not shown).

FIG. 8A is a cross-sectional view showing a memory cell in the most general DRAM. n+ diffusion regions 102 and 105 are formed on a silicon substrate 101. Storage capacitance is formed of the n+ diffusion region 102, a first polysilicon (polycrystalline silicon) layer 103 and a thin oxide film 104 therebetween. In addition, an access transistor is formed of the n+ diffusion region 102, the n+ diffusion region 105 and a second polysilicon layer 106 provided in the upper portion of a region therebetween through an insulating film. Furthermore, a contact is formed between a first aluminum layer 107 and the n+ diffusion region 105. The first polysilicon layer 103 is used as a cell plate electrode, the second polysilicon layer 106 is used as a word line, and the first aluminum layer 107 is used as a bit line. The memory cell thus formed is isolated from another memory cell by a silicon oxide film 108.

FIG. 8C shows an equivalent circuit of the memory cell. A bit line BL and a word line WL are respectively formed of the first aluminum layer 107 and the second polysilicon layer 106 shown in FIG. 8A. In addition, a storage node N is formed of the n+ diffusion region 102, and a cell plate electrode PL is formed of the first polysilicon layer 103.

A polysilicon layer and an aluminum layer have been conventionally used as interconnection materials of the semiconductor memory device because they are easily formed. Since the melting point of aluminum is lower than that of polysilicon, the polysilicon layer is used as the word line WL.

FIG. 9 is a block diagram showing the entire layout of the DRAM having a structure shown in FIG. 7.

This DRAM comprises eight memory arrays aligned. The eight memory arrays are divided into four blocks, each of the blocks comprising memory arrays 10a and 10b. A sense amplifier portion 30 and an I/O gate portion 40 corresponding to the memory array 10a, a sense amplifier portion 30 and an I/O gate portion 40 corresponding to the memory array 10b, and a Y decoder 50 which is common thereto are arranged between the memory arrays 10a and 10b. In addition, each of the memory arrays 10a and 10b is provided with an X decoder 20. Furthermore, a peripheral circuit 60 is provided in the side portion of the aligned eight memory arrays. The peripheral circuit 60 comprises a circuit for generating a signal for driving the memory arrays 10a and 10b, the X decoders 20, the Y decoders 50, the sense amplifier portions 30 and the like, an address buffer for applying an externally applied address signal to the X decoders 20 and the Y decoders 50, and a circuit for inputting or outputting data to or from the I/O gate portions 40.

The Japanese Laying-Open Gazette Publication No. 180594/1987 discloses a semiconductor memory device comprising two memory cell array blocks, a peripheral circuit for normal access and a peripheral circuit for refreshing which are arranged therebetween. In this semiconductor memory device, either one of the two memory cell array blocks is selectively driven. This semiconductor memory device has the advantage that interconnections connected between the peripheral circuit for normal access and the peripheral circuit for refreshing and the two memory cell array blocks may be short. However, the semiconductor memory device has the disadvantage that there is a limit in increasing capacity because only two memory cell array blocks are driven by the peripheral circuit for normal access and the peripheral circuit for refreshing.

For example, in the case of a 1 M-bit DRAM, a single memory array comprises 256 word lines and 512 bit line pairs. Thus, each of the word lines intersects with the 1024 bit lines, so that the length thereof is substantially increased. Therefore, if and when a word line is formed of a polysilicon layer as described above, the resistance value of the word line becomes high. As a result, there is considerable delay time from the time when an output of the X decoder 20 rises to the time when a gate potential of an access transistor of a memory cell in a position farthest away from the X decoder 20 rises. This delay time is not preferable because it leads to the delay of access time in the DRAM, thereby to degrade the performance of the DRAM.

In order to solve the delay in each of the word lines, a shunt interconnection for a word line as described below is used. FIGS. 10A and 10B are diagrams for explaining this shunt interconnection for a word line. An aluminum layer AL is provided in the upper portion of a word line WL formed of a polysilicon layer. Contact portions CN are formed between the word line WL and the aluminum layer AL at three points obtained by dividing the word line WL into four equal parts and two points on both sides thereof. Sheet resistance (resistance per unit width) of aluminum can be ignored because it is lower than that of polysilicon by three orders of magnitude. It is assumed that the resistance value of the word line WL from an X decoder 20 to a memory cell in a position farthest away therefrom is 4R0 when there is no shunt interconnection. As shown in FIG. 10A, when there is a shunt interconnection, the resistance value from the X decoder 20 to a memory cell in a middle position between the adjacent contact portions CN is highest. However, the resistance value in this case becomes ($\frac{1}{2}$) R0, which is one-eighth of the resistance value obtained when there is no shunt interconnection.

If and when a shunt interconnection is provided for a word line as described above, the spacing must be provided between memory cells so as to provide contact portions between the word line and an aluminum layer. Therefore, as shown in FIG. 10B, a memory array 10 is divided into four groups 11 of memory cells, the spacing 12 for connections CN of a shunt portion being provided between the adjacent groups 11 of memory cells.

FIG. 8B is a cross-sectional view showing a memory cell in a case in which a shunt interconnection for a word line is provided. In the memory cell shown in FIG. 8B, a bit line is formed of a third polysilicon layer 109 instead of the first aluminum layer 107. In addition, a first aluminum layer 110 is formed above the second polysilicon layer 106 to be a word line in parallel with the second polysilicon layer 106. Contact portions are formed for each constant distance, as shown in FIG. 10A, between the first aluminum layer 110 and the second polysilicon layer 106. Consequently, the resistance value of the word line formed of the second polysilicon layer 106 is decreased, so that delay time in changing a potential transmitted through the word line is decreased.

FIG. 11 is a circuit diagram showing a structure of a main part of another DRAM. In this DRAM, a Y decoder 50 is common to a plurality of memory arrays. In FIG. 11, the Y decoder 50 is common to memory arrays 10a and 10b. In this case, a column selecting line CL of the Y decoder 50 is formed of an aluminum layer. This column selecting line CL is provided so as to cross the memory arrays 10a and 10b. Since an ordinary column selecting line is formed of the same interconnection layer as that forming any one of a bit line, a word line and a shunt interconnection for the word line, the column selecting line can not cross memory arrays. Therefore, when a first aluminum layer is used in a memory cell as shown in Figs. 8 and 8B, the column selecting line is formed of a second aluminum layer.

The foregoing is also described in FIG. 8 of IEEE Journal of Solid-State Circuits, Vol. SC-21, No. 3, June 1986.

The advantage of the structure shown in FIG. 11 is that separate Y decoders are not required for each memory array since a single Y decoder 50 is provided in an end of a group of memory arrays and only column selecting lines are extended to a plurality of memory arrays.

Furthermore, in the DRAM shown in FIG. 11, a shared sense amplifier is used. In the shared sense amplifier, two bit line pairs are driven by a single sense amplifier SA, as shown in FIG. 11. More specifically, the sense amplifier SA is connected to bit line pairs BL1 and BL2 in the memory array 10a through transistors Q3 and Q4 and connected to bit line pairs BL3 and BL4 in the memory array 10b through transistors Q5 and Q6. The plurality of transistors Q3 and Q4 constitute a first array selecting switch 70a, and the plurality of transistors Q5 and Q6 constitute a second array selecting switch 70b.

Referring to a timing chart of FIG. 12, description is made of an operation of the shared sense amplifier shown in FIG. 11.

In FIG. 12, when an externally applied row address strobe signal $\overline{RAS}$ is at the "H" level, i.e., in the inactive state, a first switch activating signal $\phi_{S1}$ and a second switch activating signal $\phi_{S2}$ are both at the "H" level. Thus, the transistors Q3 to Q6 are all in the on state, so that the bit line pairs BL1 and BL 2 and the bit line pairs BL3 and BL4 are connected to the sense amplifier SA.

When the row address strobe signal $\overline{RAS}$ falls to the "L" level so that the DRAM is rendered active, either one of the memory arrays 10a and 10b is selected in response to an externally applied X address signal. For example, when the memory array 10a is selected, the first switch activating signal $\phi_{S1}$ remains at the "H" level while the second switch activating signal $\phi_{S2}$ falls to the "L" level. Consequently, the transistors Q5 and Q6 are turned off, so that the bit line pair BL3 and BL4 is electrically disconnected from the sense amplifier SA. In this case, all bit line pairs in the memory array 10b are electrically disconnected from sense amplifiers.

Then, a potential on a single word line WL in the memory array 10a rises in response to the X address signal, so that information charges stored in a plurality of memory cells connected to the word line are respectively read out to corresponding bit lines. On this occasion, a potential on a word line in the memory array 10b does not rise. A sense amplifier activating signal $\phi_{SA}$ rises to the "H" level so that the sense amplifier SA is activated, whereby a potential difference between two bit lines constituting each bit line pair is amplified. In FIG. 12, potentials on bit lines constituting each bit line pair are denoted by BL and $\overline{BL}$. Thereafter, a single column selecting line CL is selected in response to an externally applied Y address signal, so that a column selecting signal $\phi_{CS}$ applied to the column selecting line CL rises to the "H" level. As a result, a set of transistors Q1 and Q2 are turned on, so that the corresponding bit line pair BL1 and $\overline{BL2}$ is connected to an input/output line pair I/O and $\overline{I/O}$.

Meanwhile, the above described shared sense amplifier can be applied to a DRAM having a structure in which column selecting lines do not cross memory arrays, as shown in FIG. 13. In this case, in order to connect a bit line pair BL1 and BL2 in a memory array 10a to an input/output line pair I/O and I/O as shown in FIG. 13, it is necessary to connect the bit line pair BL1 and BL2 to the input/output line pair I/O and I/O through a bit line pair BL3 and BL4 by activating a sense amplifier SA and then, turning transistors Q5 and Q6 on again. On this occasion, since bit lines in a memory array 10b is charged and discharged, the DRAM shown in FIG. 13 is less advantageous than the DRAM shown in FIG. 11 in terms of power consumption and access time.

FIG. 14 is a block diagram showing the entire layout of the DRAM having the structure shown in FIG. 11.

In FIG. 14, eight memory arrays are aligned, a single Y decoder 50 being provided in an end thereof. The eight memory arrays are divided into four blocks, each of the blocks comprising memory arrays 10a and 10b. A first array selecting switch 70a for selecting the memory array 10a, a second array selecting switch 70b for selecting the memory array 10b, a sense amplifier portion 30 and an I/O gate portion 40 which are common thereto are provided between the memory arrays 10a and 10b within each of the four blocks. Use of two array selecting switches 70a and 70b permits sense amplifier 30 to be shared between memory arrays 10a and 10b, permitting reduction of chip area. In addition, an X decoder 20 is provided for each of the memory arrays. Furthermore, a peripheral circuit 60 is provided in the side portion of the aligned eight memory arrays.

In this DRAM, columns in the eight memory arrays are selected by the single Y decoder 50. Therefore, column selecting lines are provided from the Y decoder 50 so as to cross the plurality of memory arrays. In FIG. 14, only a single typical column selecting line CL is illustrated.

As shown in FIGS. 9 and 14, the eight memory arrays are aligned to put the DRAM in a rectangular package. The DRAM shown in FIG. 14 using a shared sense amplifier has the advantage that the DRAM shown in FIG. 14 becomes shorter in a direction of a long side than the DRAM shown in FIG. 9 because only a single Y decoder is required.

Similarly, a semiconductor memory device in which column selecting lines from a Y decoder are provided to cross a plurality of memory array blocks is also disclosed in Japanese Patent Laying-Open Gazette No. 39196/1988.

Description is now made of the relation between a package and pads on a chip.

FIG. 15 is a diagram showing a pin arrangement of a dual inline package (DIP) of a 1 M-bit DRAM, and FIG. 16 is a diagram showing one example of a chip mounted on the package. As shown in FIG. 15, pins p1 to p18 are provided along long sides on both sides of a rectangular package. Pads p1 to p18 are arranged in the vicinity of short sides of the chip CH, as shown in FIG. 16, by restrictions caused by the shape of such a package. Peripheral circuits 60 are arranged on both sides of a circuit portion 80 comprising memory arrays, decoders and sense amplifiers. Interconnections are provided for the peripheral circuit 60 from the pads P1 to P18. In general, the width of each of the interconnections forced of aluminum is approximately 2 μm. However, since a large current flows in a power supply line (Vcc) and a ground line (Vss), the widths thereof must be approximately 100 μm.

The conventional DRAM shown in FIG. 14 has the advantage that the area for forming a Y decoder is small so that integration density can be increased because a single Y decoder is provided for a plurality of memory arrays. However, the length of a column selecting line provided to cross a plurality of memory arrays from the Y decoder is substantially increased. Consequently, the resistance value of the column selecting line is increased. As a result, in a memory array in a position farthest away from the Y decoder, transmission of a column selecting signal is delayed.

Additionally, since a Y decoder is provided in an end of a plurality of memory arrays aligned and a peripheral circuit is provided along the memory arrays, interconnections connected from the peripheral circuit to the Y decoder become longer, so that transmission of signals is delayed.

SUMMARY OF THE INVENTION

An object of the present invention is to provide a semiconductor memory device capable of performing a high-speed operation and having a small chip area.

Another object of the present invention is to provide a large capacity semiconductor memory device in which transmission of signals is not delayed without increasing the chip area.

Still another object of the present invention is to reduce the delay of transmission of signals in column selecting lines without increasing the chip area in a semiconductor memory device comprising a plurality of memory arrays.

Still another object of the present invention is to reduce the delay of transmission of signals from a peripheral circuit to a column decoder in a semiconductor memory device comprising a plurality of memory arrays.

A further object of the present invention is to reduce the delay of transmission of signals from a peripheral circuit to a row decoder in a semiconductor memory device comprising a plurality of memory arrays.

A still further object of the present invention is to prevent the increase in the chip area caused by interconnections such as an external signal line, a power supply line and a ground line in a semiconductor memory device.

The semiconductor memory device according to the present invention comprises a plurality of first and second memory arrays, a plurality of first and second column selecting lines, column selecting means, a plurality of row selecting means, and circuit means for driving the column selecting means and the plurality of row selecting means.

Each of the plurality of first and second memory arrays comprises a plurality of memory cells arranged in a plurality of rows and columns. The plurality of first column selecting lines are provided corresponding to a plurality of columns. Each of the plurality of first column selecting lines is used for simultaneously selecting corresponding columns in the plurality of first memory arrays. In addition, the plurality of second column selecting lines are provided corresponding to the plurality of columns. Each of the plurality of second column selecting lines is used for simultaneously selecting corresponding columns in the plurality of second memory arrays. The column selecting means selects any of the plurality of first and second column selecting lines so as to select any of the plurality of columns in the plurality of first and second memory arrays. The plurality of row selecting means are provided corresponding to the plurality of first and second memory arrays. Each of the plurality of row selecting means selects any one of the plurality of rows in the corresponding memory array.

Additionally, a plurality of first and second memory arrays are arranged in the same column, and the column selecting means and the circuit means are arranged between the plurality of first and second memory arrays.

In the semiconductor memory device according to the present invention, since columns in the plurality of first memory arrays are selected by the first column selecting lines and columns in the plurality of second memory arrays are selected by the second column selecting lines, the length of each of the first and second column selecting lines is reduced. Therefore, a column selecting signal for selecting columns in the first and second memory arrays is not delayed.

Furthermore, since only single column selecting means is employed so as to select columns in the plurality of first and second memory arrays, the chip area is reduced.

Additionally, since the circuit means for driving the column selecting means and the plurality of row selecting means is provided in the vicinity of the column selecting means between the plurality of first and second memory arrays, interconnections connected from the circuit means to the column selecting means becomes shorter. In addition, the length of the longest interconnection out of interconnections connected from the circuit means to the plurality of row selecting means becomes a minimum.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4A is a diagram showing the plane layout of a part of each of the memory arrays shown in FIG. 3;

DESCRIPTION OF THE PREFERRED EMBODIMENTS

Figure 1:
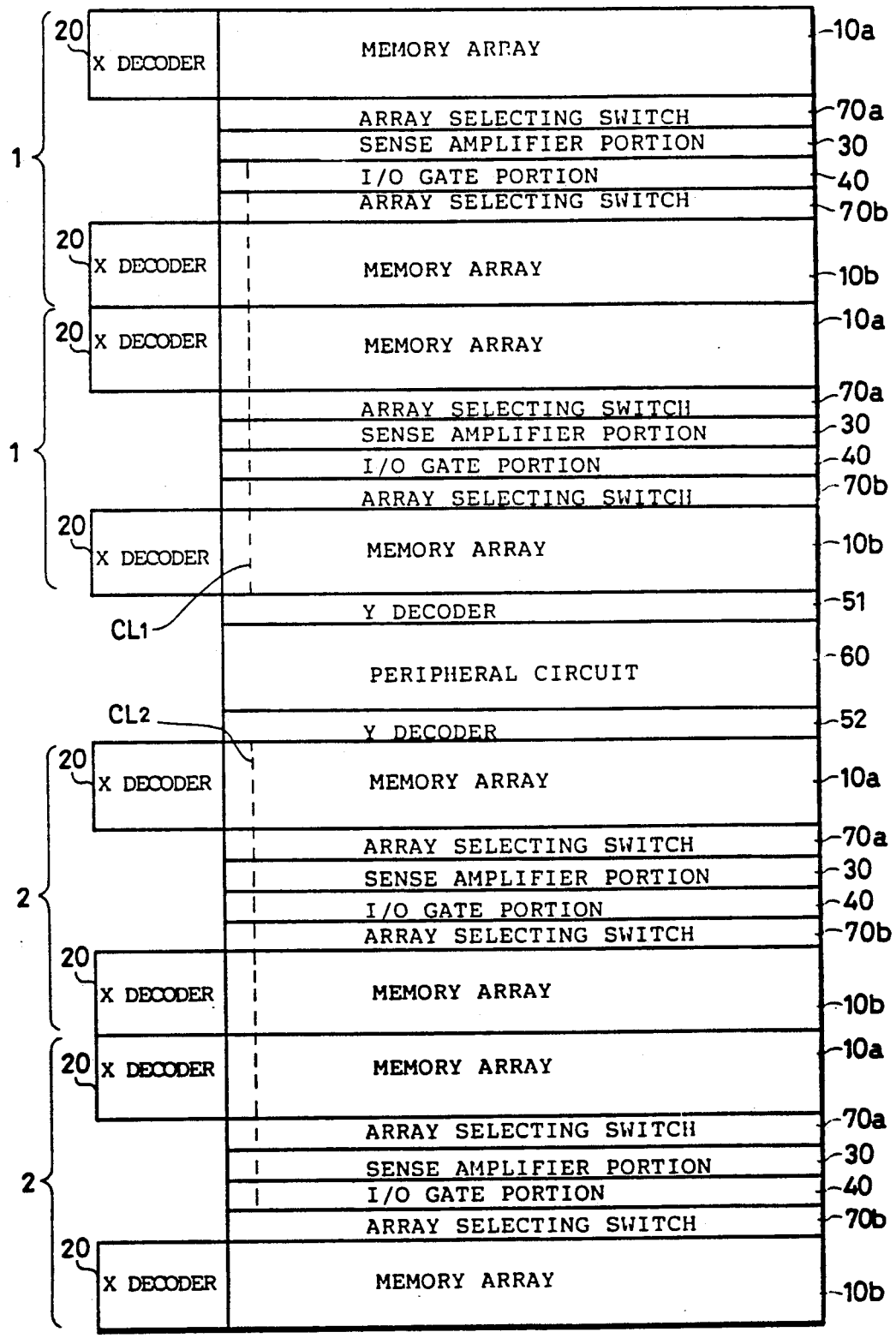
FIG. 1 is a block diagram showing the layout of a DRAM according to an embodiment of the present invention.

Referring now to the drawings, embodiments of the present invention will be described in detail.

FIG. 1 is a diagram showing the entire layout of a DRAM according to an embodiment of the present invention.

In FIG. 1, eight memory arrays are aligned. The eight memory arrays are divided into four blocks 1, 2 each of the blocks 1, 2 comprising memory arrays 10$a$ and 10$b$. The four blocks 1, 2 are divided at the central portion thereof into parts each comprising two blocks. A peripheral circuit 60 is arranged in the central portion thereof, Y decoders 51 and 52 being arranged with the peripheral circuit 60 interposed therebetween. An X decoder 20 is provided for each of the eight memory arrays.

A first array selecting switch 70$a$ for selecting the memory array 10$a$, a second array selecting switch 70$b$ for selecting the memory array 10$b$, and a sense amplifier portion 30 and an I/O gate portion 40 which are common thereto are provided between the memory arrays 10$a$ and 10$b$ in each block.

Furthermore, a plurality of first column selecting lines CL1, CL2 are provided so as to cross the three memory arrays arranged on one side of the peripheral circuit 60 from the Y decoder 51 to the I/O gate portion 40. In addition, a plurality of second column selecting lines are provided so as to cross the three memory arrays arranged on the other side of the peripheral circuit 60 from the Y decoder 52 to the I/O gate portion 40. In FIG. 1, a single typical first column selecting line CL1 and a single typical second column selecting line CL2 are typically represented by broken lines.

Figure 7:
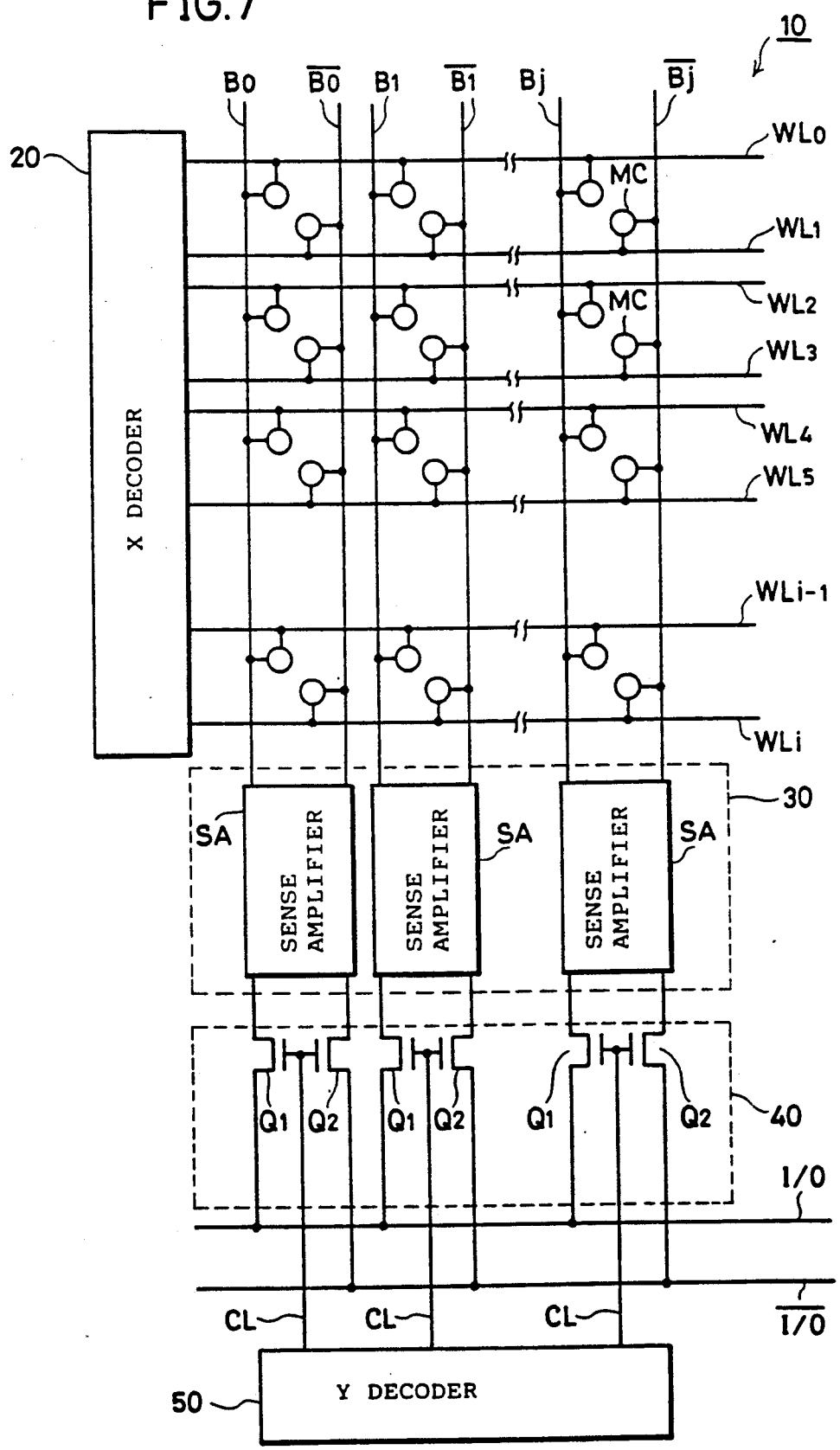
FIG. 7 is a diagram showing a general structure of a memory array in a DRAM.
Figure 11:
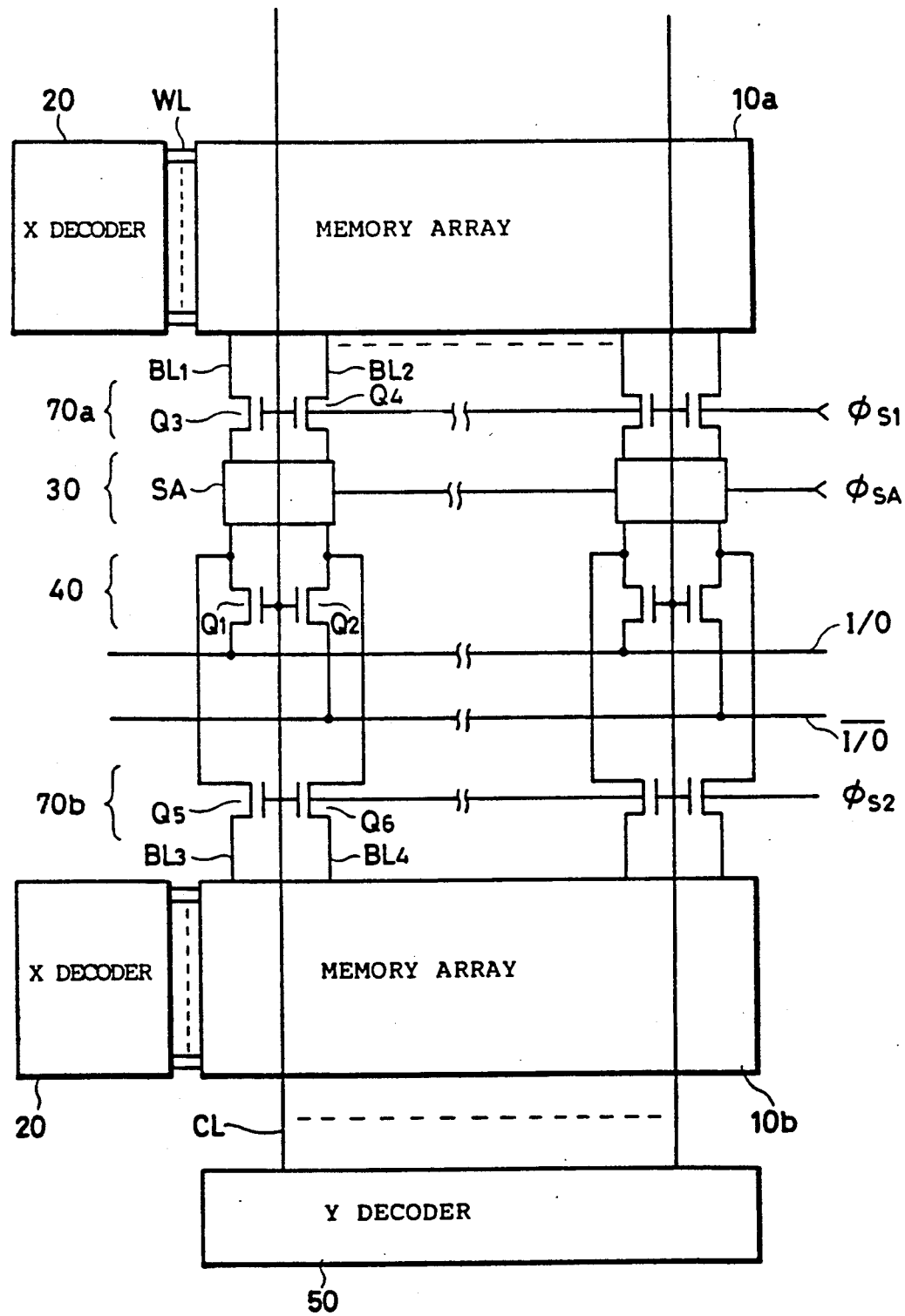
FIG. 11 is a circuit diagram showing a structure of a main part of a DRAM using a shared sense amplifier.
Figure 12:
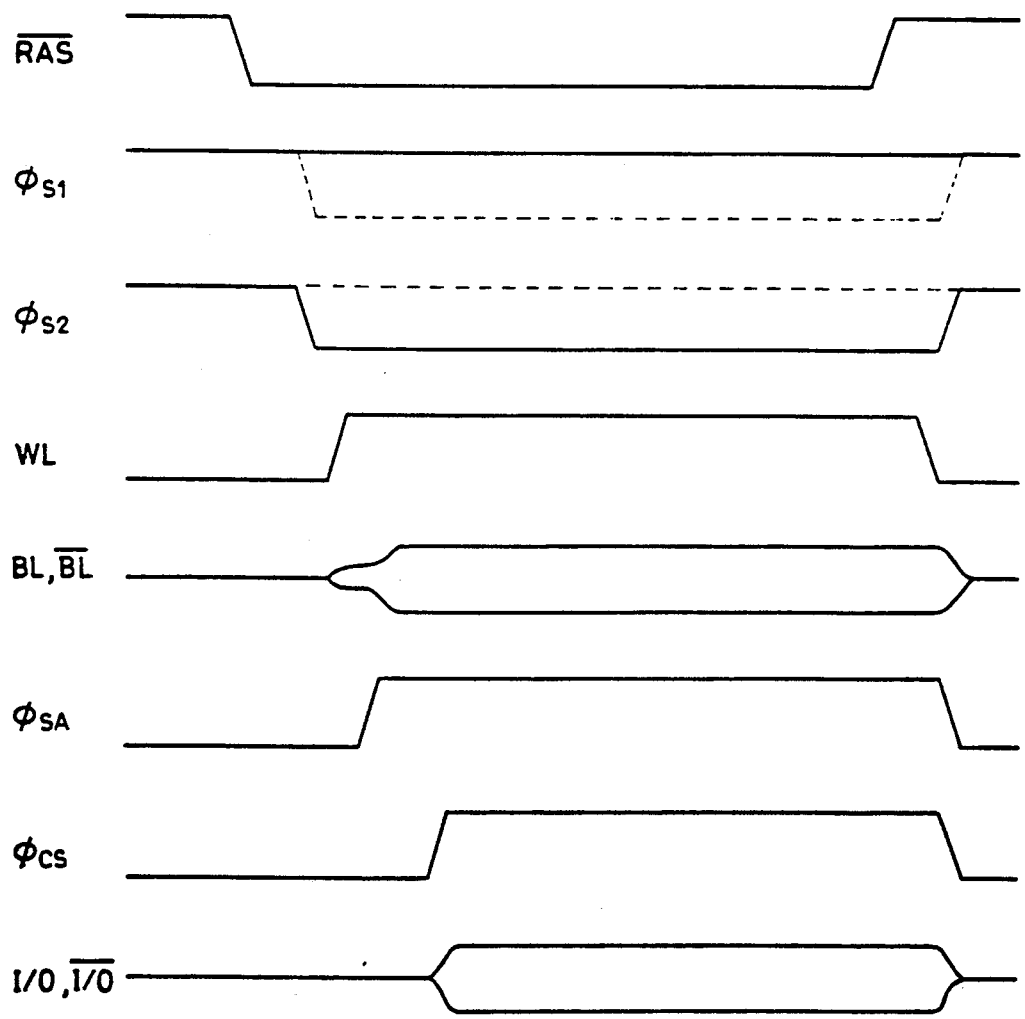
FIG. 12 is a timing chart for explaining an operation of the shared sense amplifier.
Figure 13:
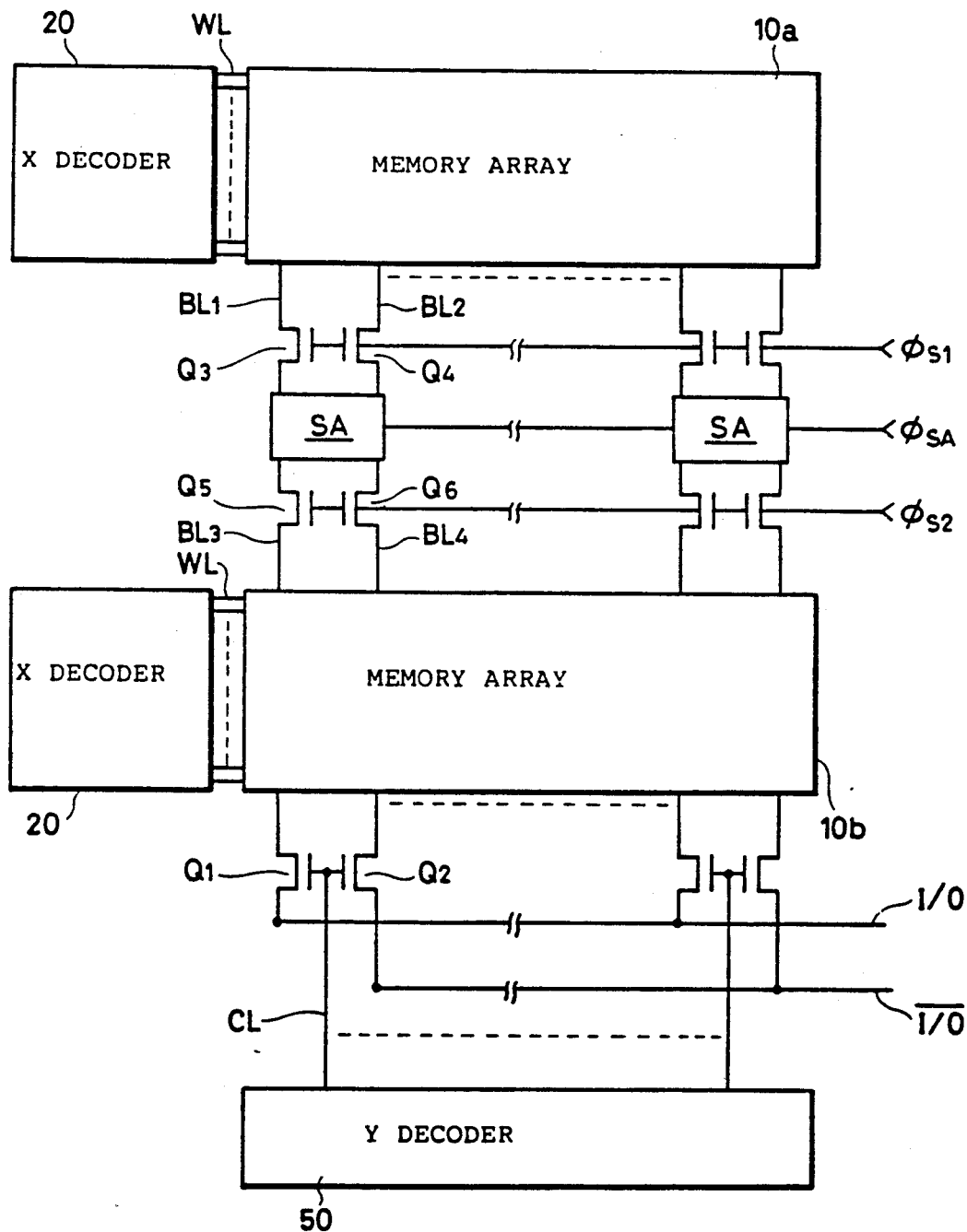
FIG. 13 is a circuit diagram showing a structure of a main part of a DRAM using a shared sense amplifier of a type in which column selecting lines do not cross memory arrays.

A structure of each of the memory arrays 10$a$ and 10$b$ is the same as that of the memory array 10 shown in FIG. 7. In addition, structures of the first array selecting switch 70$a$, the sense amplifier portion 30, the I/O gate portion 40 and the second array selecting switch 70$b$ are the same as those shown in FIG. 11.

Figure 2:
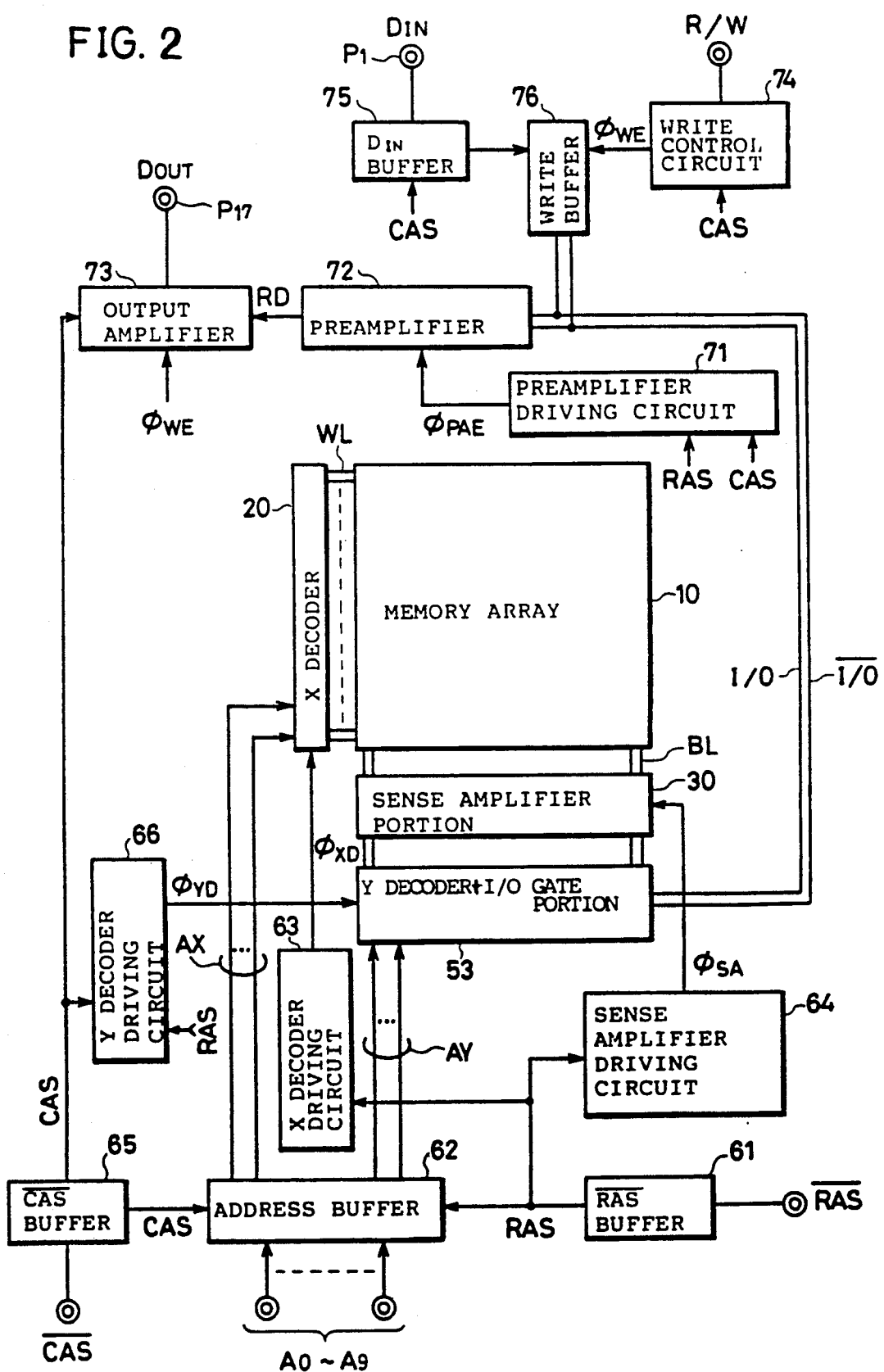
FIG. 2 is a block diagram showing a structure of a peripheral circuit included in the DRAM shown in FIG. 1.

FIG. 2 is a block diagram for explaining a structure of the peripheral circuit 60 shown in FIG. 1. In FIG. 2, a RAS buffer 61 is responsive to an externally applied row address strobe signal $\overline{RAS}$ for generating an internal row address strobe signal RAS. An address buffer 62 is triggered by the internal row address strobe signal RAS, to accept externally applied address signals A0 to A9 to generate X address signals Ax. An X decoder driving circuit 63 is responsive to the internal row address strobe signal RAS for generating an X decoder driving signal $\phi_{XD}$. An X decoder 20 is responsive to this X decoder driving signal $\phi_{XD}$ for selecting a single word line in accordance with the X address signals, to raise a potential thereon. A sense amplifier driving circuit 64 is responsive to the internal row address strobe signal RAS for generating a sense amplifier activating signal $\phi_{SA}$ after predetermined delay. A sense amplifier portion 30 is responsive to this sense amplifier activating signal $\phi_{SA}$ for amplifying a potential difference between bit lines.

On the other hand, a $\overline{CAS}$ buffer 65 is responsive to an externally applied column address strobe signal $\overline{CAS}$ for generating an internal column address strobe signal CAS. The address buffer 62 is triggered by this internal column address strobe signal CAS, to accept the externally applied address signals A0 to A9 and generate Y address signals AY. A Y decoder driving circuit 66 is responsive to the internal column address strobe signal CAS for generating a Y decoder driving signal $\phi_{YD}$. A block 53 comprising a Y decoder and an I/O gate portion is responsive to this Y decoder driving signal $\phi_{YD}$ for connecting a single bit line pair to an input/output line pair I/O and $\overline{I/O}$ in accordance with the Y address signals AY.

A preamplifier driving circuit 71 is responsive to the internal row address strobe signal RAS and the internal column address strobe signal CAS for generating a preamplifier driving signal $\phi_{PAE}$. A preamplifier 72 is responsive to this preamplifier driving signal $\phi_{PAE}$ for amplifying information on the input/output line pair I/O and $\overline{I/O}$, to send the same to an output amplifier 73 as read-out data RD. The output amplifier 73 is responsive to the internal column address strobe signal CAS for amplifying the read-out data RD, to output the same to an external data output pin P17 as output data $D_{OUT}$.

Furthermore, a write-in control circuit 74 is triggered by the internal column address strobe signal CAS, to accept an externally applied control signal R/W to generate a write enable signal $\phi_{WE}$. A $D_{IN}$ buffer 75 is triggered by the internal column address strobe signal CAS, to accept input data $D_{IN}$ applied to an external data input pin P1 to generate internal write-in data. A write-in buffer 76 is responsive to the write enable signal $\phi_{WE}$ for transferring the internal write-in data to the input/output line pair I/O and $\overline{I/O}$.

In the above described manner, data in the memory array 10 is outputted to the external data output pin P17, and the data applied to the external data input pin P1 is written in the memory array 10.

The peripheral circuit 60 shown in FIG. 1 comprises the $\overline{RAS}$ 61, the address buffer 62, the X decoder driving circuit 63, the sense amplifier driving circuit 64, the $\overline{CAS}$ buffer 65, the Y decoder driving circuit 66, the write-in control circuit 74, and the $D_{IN}$ buffer 75 as shown in FIG. 2.

Figure 14:
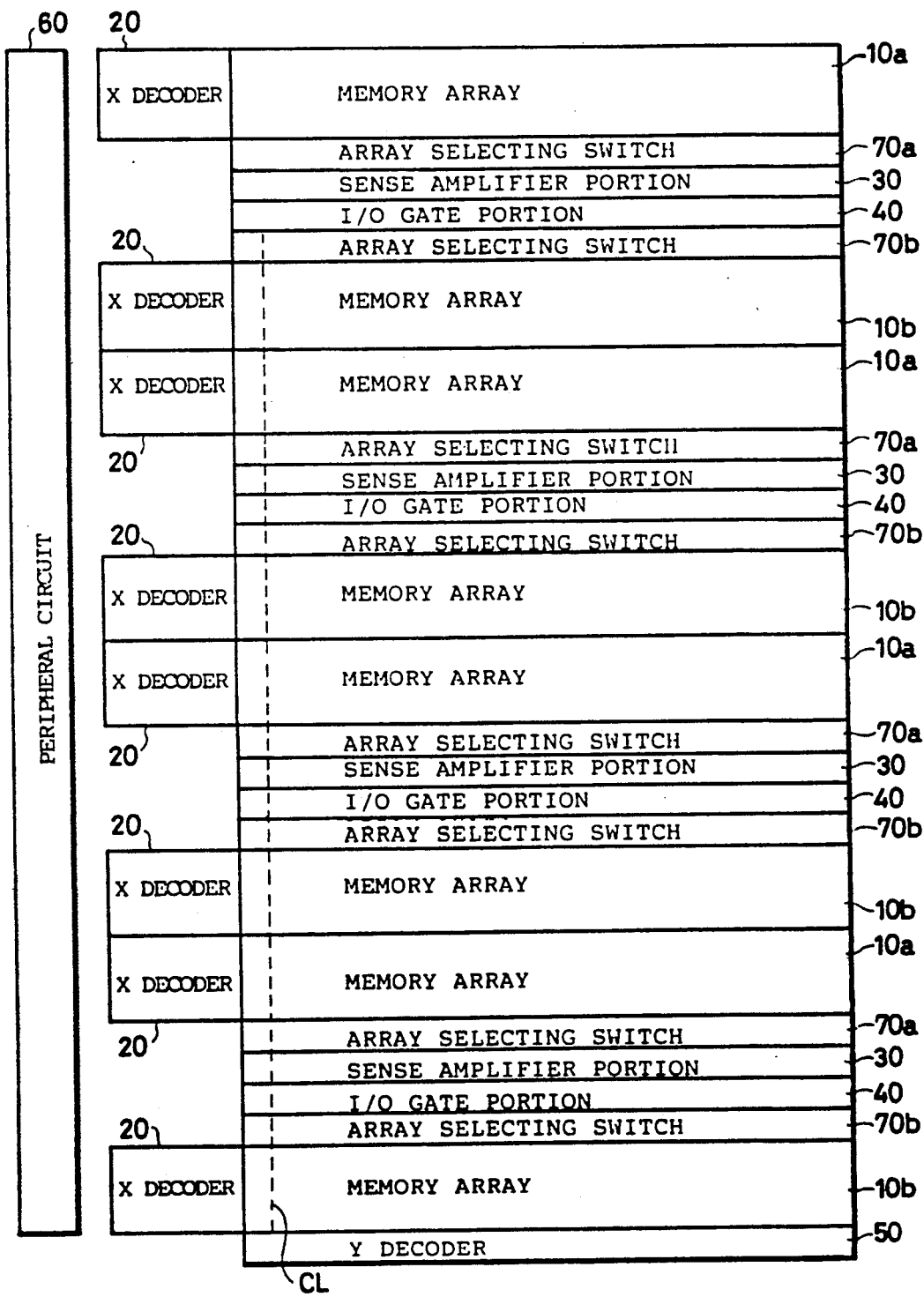
FIG. 14 is a block diagram showing the layout of another conventional DRAM.
Figure 15:
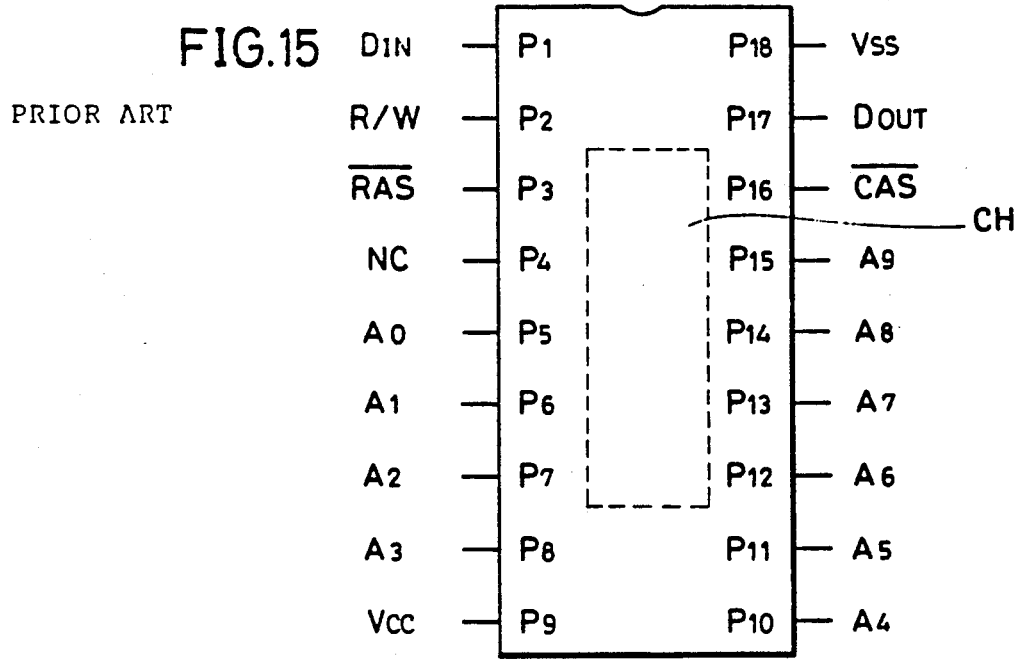
FIG. 15 is a diagram showing a pin arrangement of a package of a general 1 m-bit DRAM.

In the DRAM shown in FIG. 1, the length of each of the column selecting lines becomes approximately one-half of that in the conventional DRAM shown in FIG. 14, so that the delay time of a column selecting signal becomes approximately one-half. Therefore, the access time in the DRAM can be shortened. In addition, since the Y decoders 51 and 52 are arranged in the vicinity of the peripheral circuit 60, interconnections LY such as the Y address lines connected from the peripheral circuit 60 to the Y decoders 51 and 52 become shorter to enable reduction of chip area (referring to FIG. 3). In addition, the length of the longest interconnection out of interconnections LX such as X address lines connected from the peripheral circuit 60 to the X decoders 20 becomes a minimum (referring to FIG. 3). Thus, the delay of signals is reduced and the chip area is further reduced.

Figure 3:
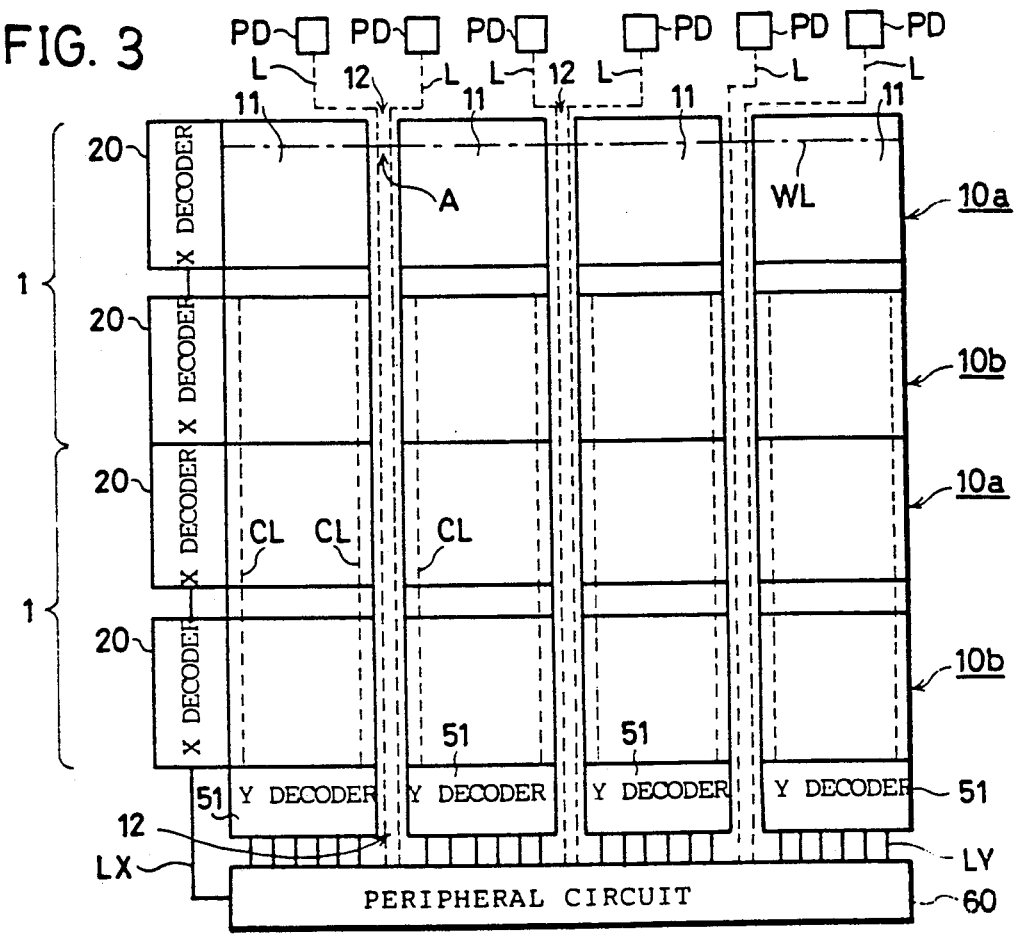
FIG. 3 is a block diagram showing a structure of memory arrays included in the DRAM shown in FIG. 1.
Figure 10A:
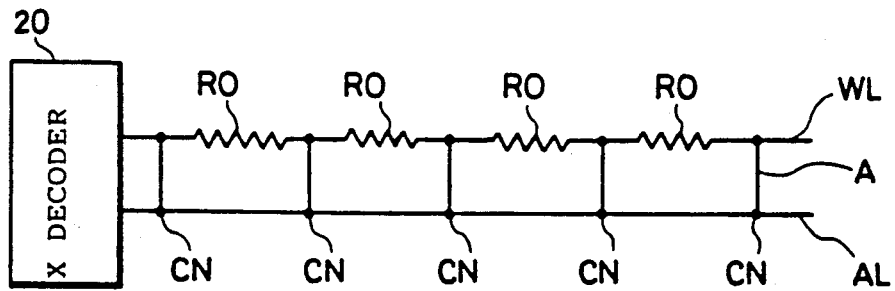
FIG. 10A is a diagram for explaining a shunt interconnection for a word line.
Figure 10B:
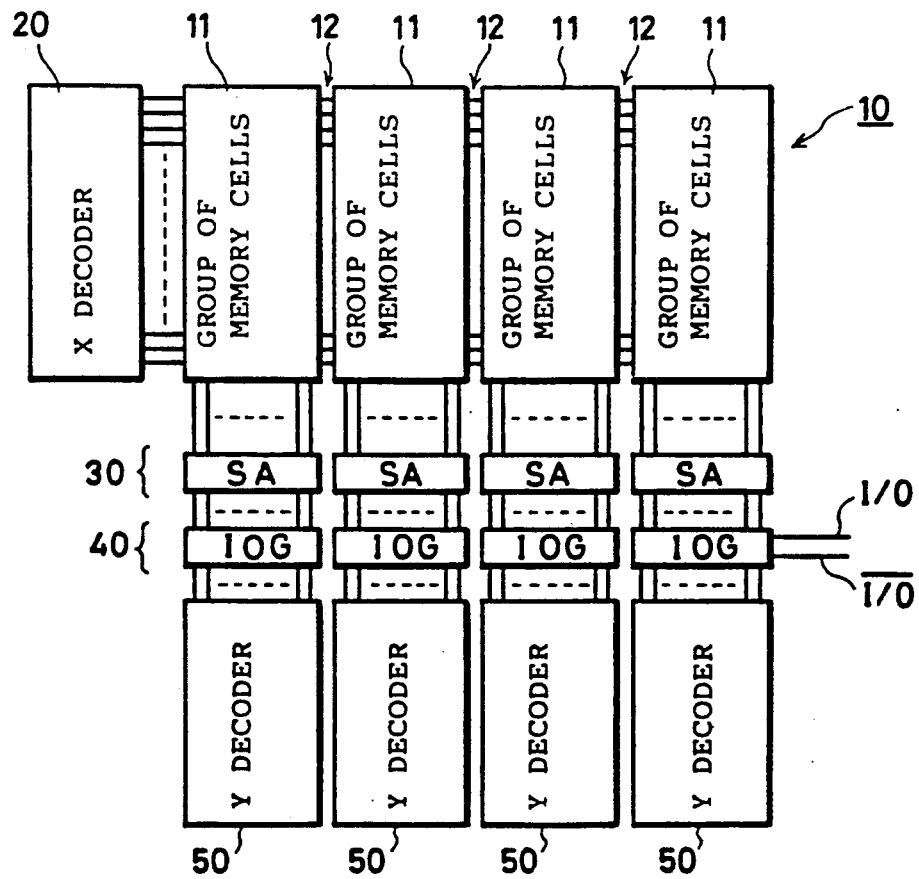
FIG. 10B is a block diagram showing a structure of a memory cell of a conventional DRAM using the shunt interconnection for a word line.

FIG. 3 is a diagram showing a structure of half of a chip of the DRAM shown in FIG. 1. A shunt interconnection as shown in FIG. 10A is provided for a word line WL in each of memory arrays 10a and 10b, as shown in FIG. 10A. Each of the memory arrays 10a and 10b is divided into four groups 11 of memory cells. The spacing 12 for connection A between a shunt portion and a word line WL is provided between the adjacent groups 11 of memory cells. No column selecting line CL passes through this spacing 12 for a word line shunt connection A. Thus, interconnection layers L for connecting a peripheral circuit 60 to pads PD are passed above this spacing 12 for a word line shunt connection A in the plane of the second Al layer. This interconnection layer L is used as an interconnection such an external signal interconnection, a power supply line and a ground line for transmitting an external signal, a power-supply potential, a ground potential or the like from the pads PD to the peripheral circuit 60 in the central portion. This interconnection layer L can be formed of the same type of layer as that of the column selecting line CL.

Figure 4B:
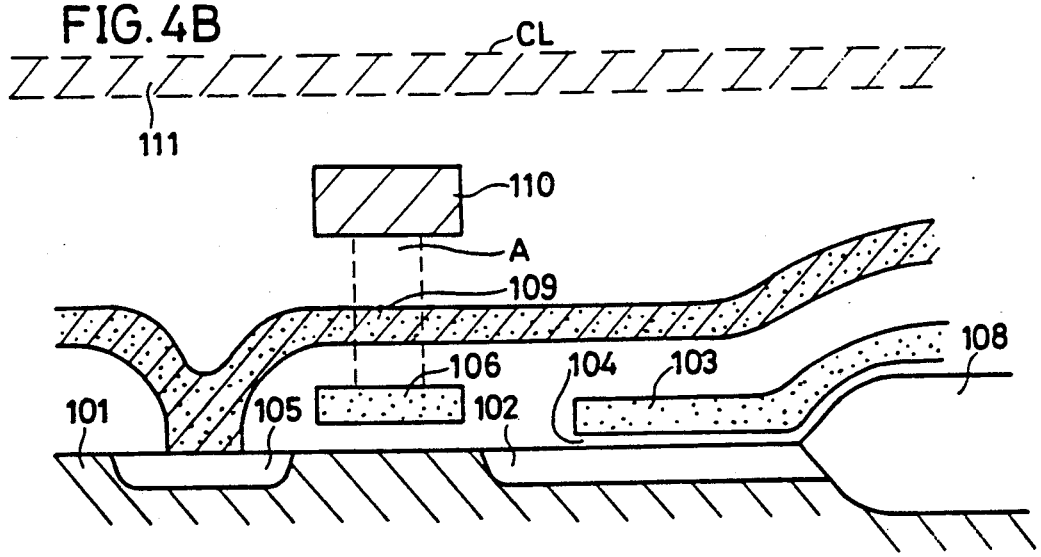
FIG. 4B is a cross-sectional view showing memory cells included in the memory array shown in FIG. 3.

FIG. 4A is a diagram showing a plane pattern of a part of a memory array, and FIG. 4B is a cross-sectional view showing a memory cell included in the DRAM according to the present embodiment.

Figure 8A:
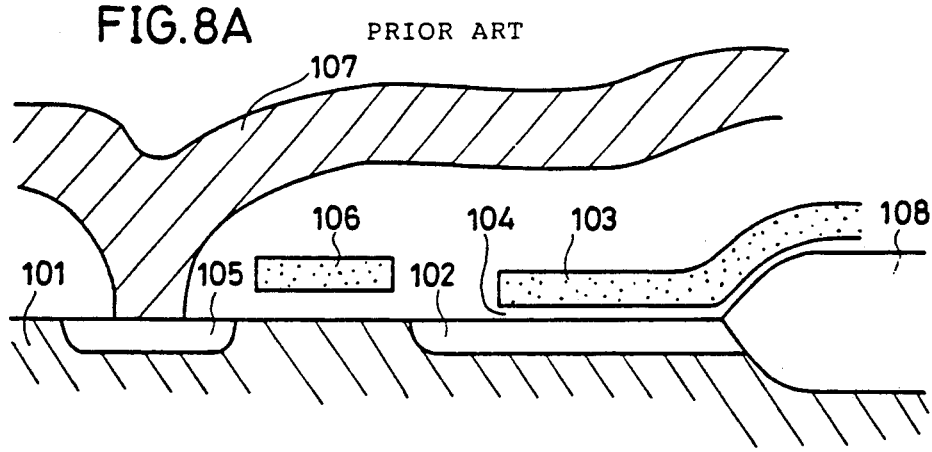
FIG. 8A is a cross-sectional view showing one example of a memory array in a DRAM.
Figure 8B:
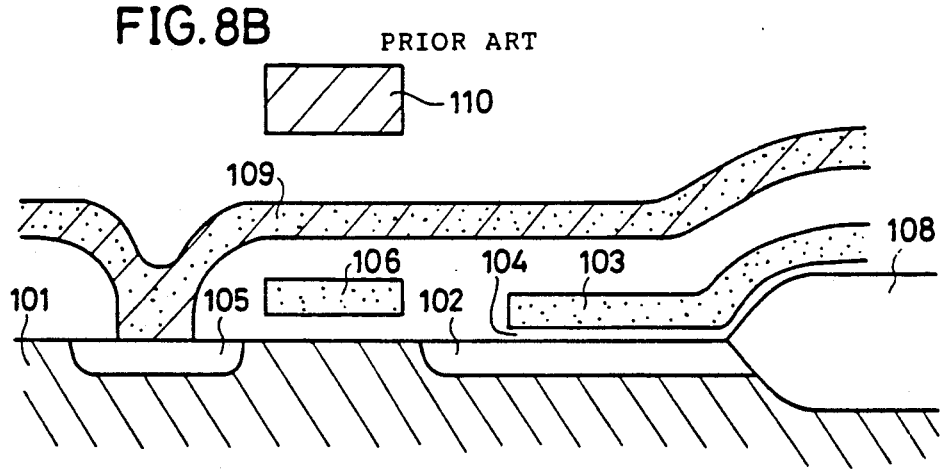
FIG. 8B a cross-sectional view showing another example of a memory cell in the DRAM.
Figure 8C:
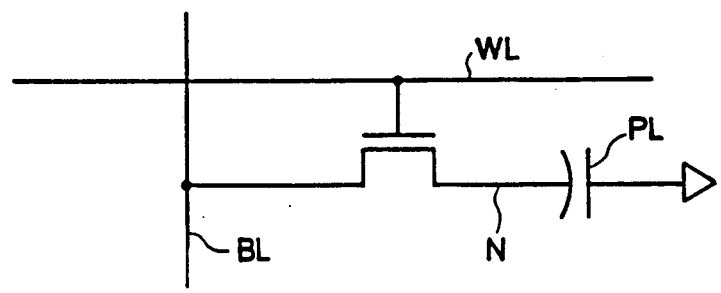
FIG. 8C is a diagram showing an equivalent circuit of a memory cell.
Figure 9:
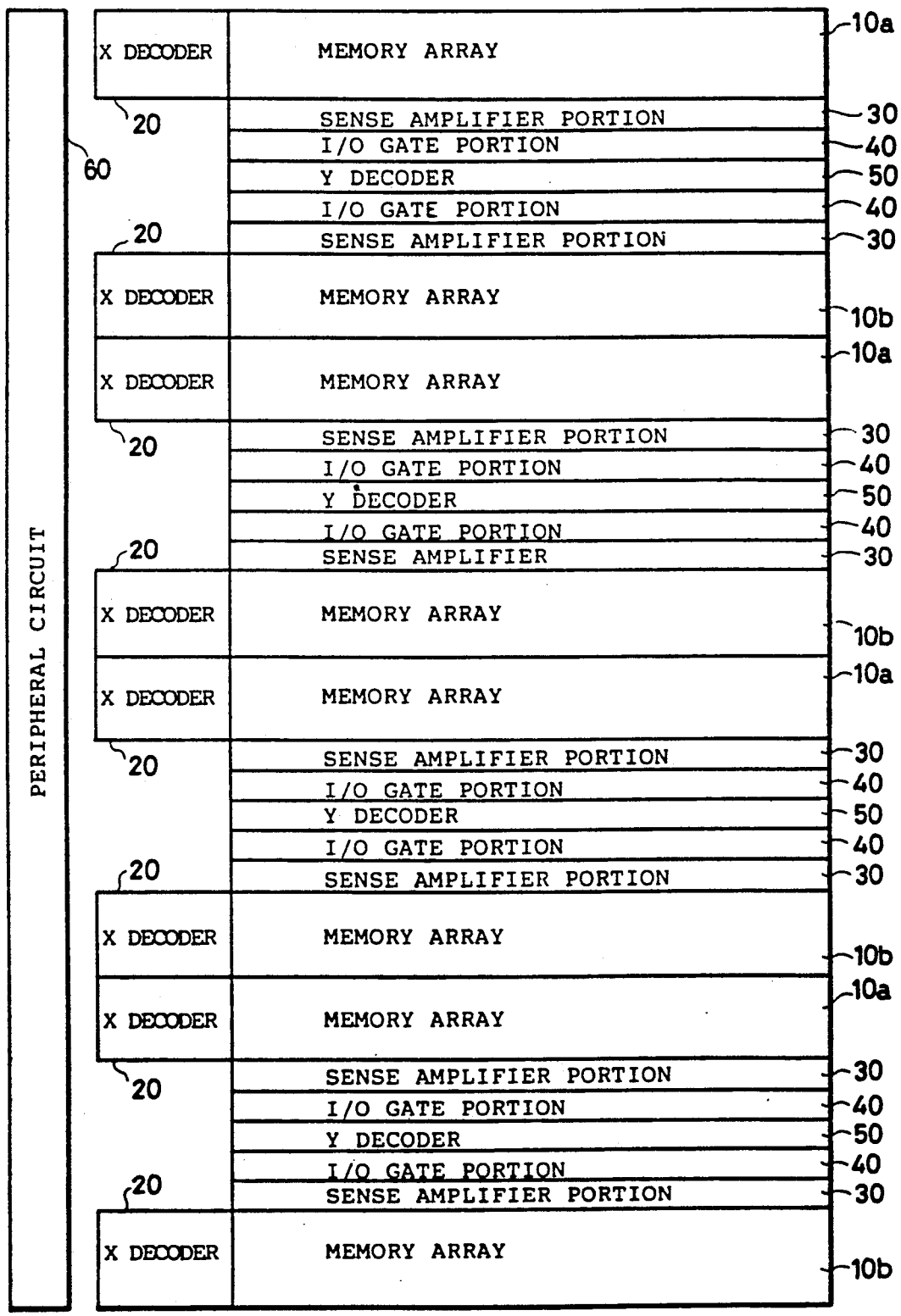
FIG. 9 is a block diagram showing the layout of a conventional DRAM.

As shown in FIG. 4B, a cell plate is formed of a first polysilicon layer 103, a word line is formed of a second polysilicon layer 106, and a bit line is formed of a third polysilicon layer 109, as in the memory cell shown in FIG. 8B. In addition, a shunt interconnection for a word line is formed of a first aluminum layer 110. Meanwhile, a gate electrode, i.e., a word line of an access transistor may be formed of a polyside layer comprising siliside and polysilicon, and the shunt interconnection for a word line may be formed of a metal interconnection layer having low resistance other than aluminum.

Additionally, as shown in FIG. 4A, each of memory cells MC is connected to a bit line formed of a third polysilicon layer 109 in a contact portion 114. A single bit line formed of a third polysilicon layer 109 is provided for memory cells MC in one column. In addition, a column selecting line formed of a second aluminum layer 111 is provided between a single bit line pair formed of a third polysilicon layer 109.

Meanwhile, the second aluminum layer 111 to be a column selecting line is provided in the upper portion of a memory cell, as shown in, for example, FIG. 4B.

Since not more than one column selecting line formed of the second aluminum layer 111 is required for each bit line pair, a pitch of two times that between bit lines would be sufficient as a spacing of column selecting lines. Thus, an interconnection formed of the second aluminum layer 111 can be provided between two column selecting lines each formed of the second aluminum layer 111.

As shown in FIG. 4A, similarly, interconnection layers formed of second aluminum layers 112 and 113 can be provided between the column selecting lines each formed of the second aluminum layer 111. An external signal line, a power supply line, a ground line and the like can be provided from the pads PD to the peripheral circuit 60 in the central portion by using the second aluminum layers 112 and 113.

As described in the foregoing, the power supply line and the ground line must be made thicker than the other external signal lines. Therefore, a plurality of power supply lines and ground lines are run between a plurality of column selecting lines so that the plurality of power supply lines and the plurality of ground lines are respectively connected to each other in the peripheral circuit 60 in the central portion, thereby to obtain the same effect as that obtained when a single thick interconnection is provided.

In the conventional DRAM, since interconnections such as an external signal line, a power supply line and a ground line connected from pads to a peripheral circuit are provided outside of memory arrays, the chip area is increased. On the other hand, in the present embodiment, since interconnections such as an external signal line, a power supply line and a ground line are provided so as to cross memory arrays, as shown in FIGS. 3 and 4A, the area required for the interconnections is reduced, so that the chip area can be reduced.

Figure 5:
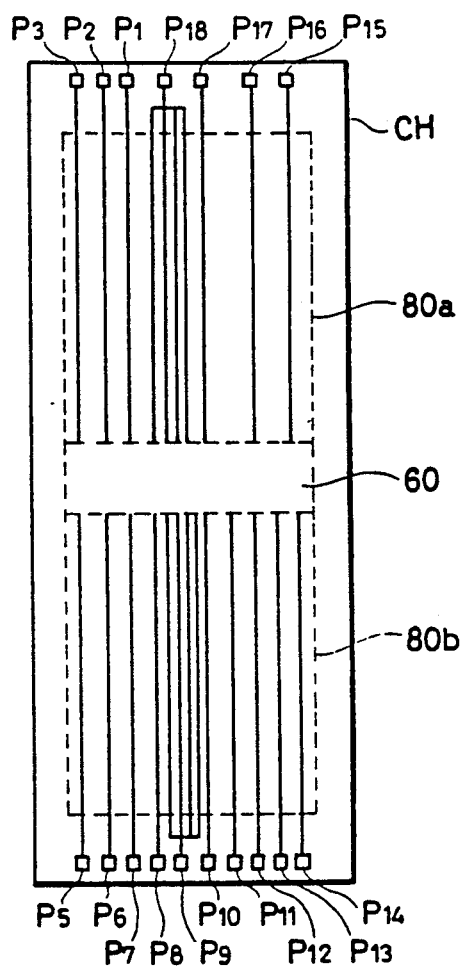
FIG. 5 is diagram showing interconnections on a chip of the DRAM shown in FIG. 1.

FIG. 5 is a diagram showing a chip of the DRAM according to the present embodiment.

Figure 16:
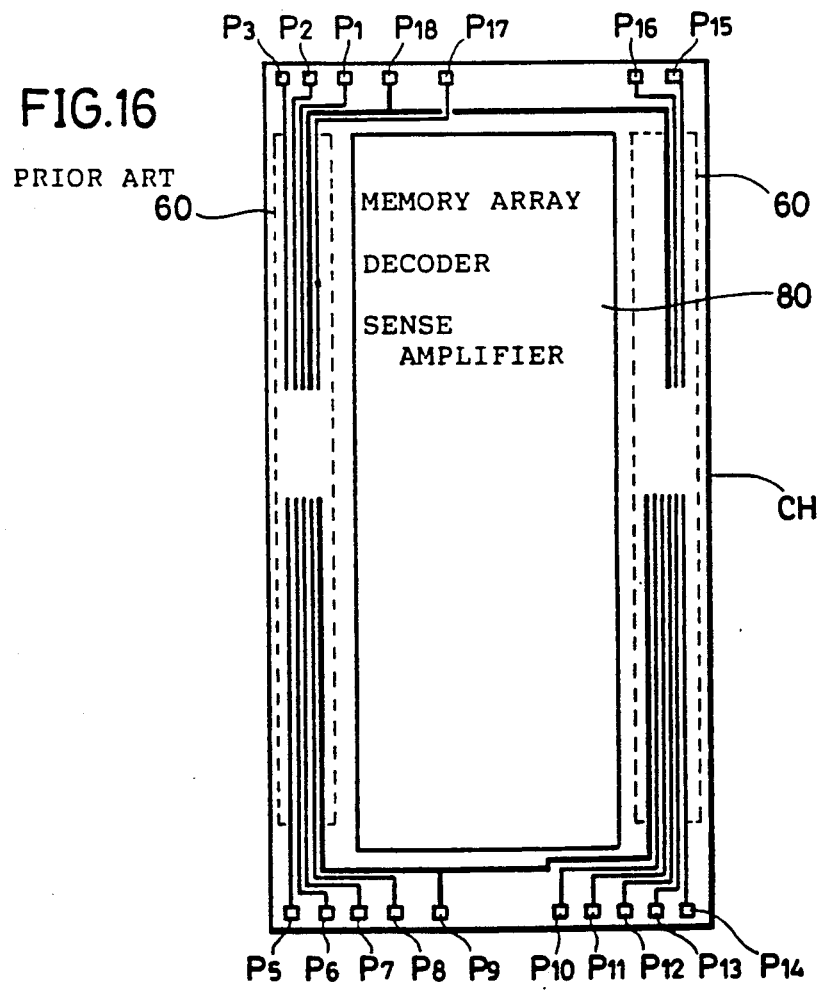
FIG. 16 is a diagram showing interconnections on a chip of a conventional 1 M-bit DRAM.

As shown in FIG. 5, pads p1 to p18 are provided in both ends of the chip. Interconnections such as an external signal line, a power supply line and a ground line connected between the pads p1 to p18 and a peripheral circuit 60 are provided so as to cross a first circuit portion 80a or a second circuit portion 80b each comprising memory arrays, decoders, sense amplifiers and the like. In the DRAM according to the present embodiment, since the peripheral circuit 60 is provided in the central portion of the chip, and the interconnections such as an external signal line, a power supply line and a ground line are not provided in the peripheral portion of the chip CH as compared prior art FIG. 16 but provided so as to cross memory arrays, the length of the chip in the direction of a short side of the chip is reduced. Since the interconnections are formed of the same interconnection layer as that forming column selecting lines CL, a special layer need not be provided in order for the interconnections cross to the memory arrays.

Figure 6:
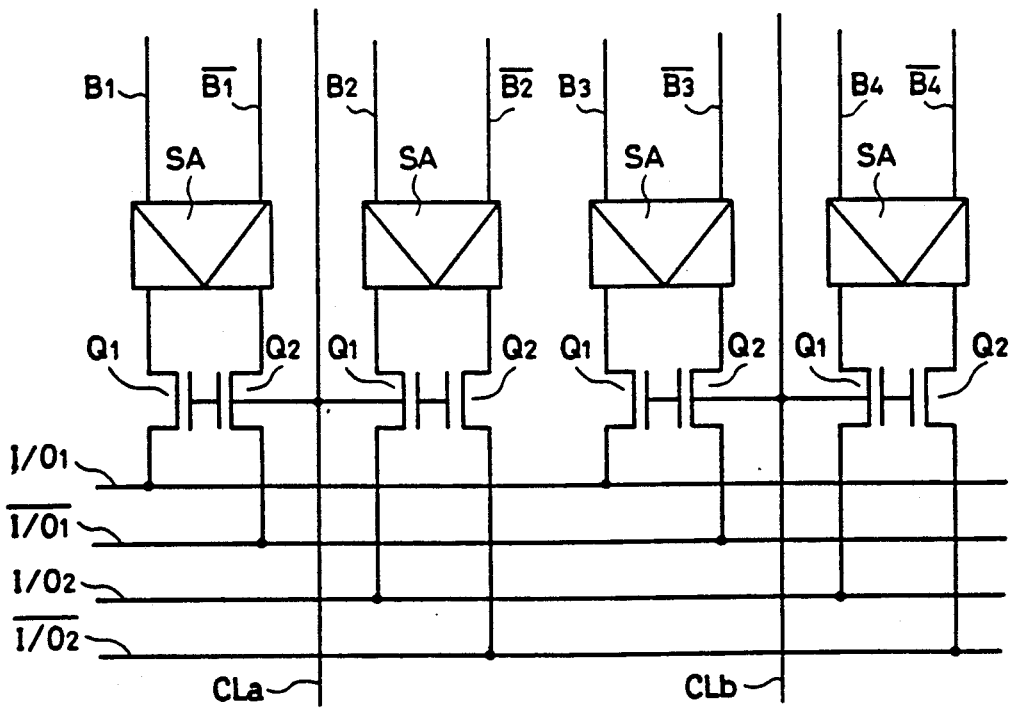
FIG. 6 is a diagram showing a structure of a main part of another DRAM to which the present invention can be applied.

Additionally, in a recent DRAM, a structure comprising two input/output line pairs as shown in FIG. 6 is employed in many cases. In FIG. 6, when a column selecting line CLa is activated, a bit line pair BL and $\overline{BL}$ is connected to an input/output line pair I/O1 and $\overline{I/O1}$ and at the same time, a bit line pair B2 and $\overline{B2}$ is connected to an input/output line pair I/O2 and $\overline{I/O2}$. In addition, when a column selecting line CLb is activated, a bit line pair B3 and B3 is connected to the input/output line pair I/O1 and I/O1 and at the same time, a bit line pair B4 and B4 is connected to the input/output line pair I/O2 and I/O2. In a DRAM having a structure shown in FIG. 6, a spacing of column selecting lines becomes four times that of bit lines. Thus, if a structure shown in FIGS. 3 and 4A is applied to the DRAM shown in FIG. 6, a thicker interconnection can be passed between the column selecting lines.

Although in the above described embodiment, description was made on a case in which the present invention is applied to a DRAM having a shunt interconnection for a word line, the present invention can be also applied to a semiconductor memory device such as a DRAM having no shunt interconnection for a word line.

As described in the foregoing, according to the present invention, circuit means and column selecting means are provided between a plurality of first memory arrays and a plurality of second memory arrays, columns in the plurality of first memory arrays being selected by a first column selecting line and columns in the plurality of second memory arrays being selected by a second column selecting line. As a result, each of the first and second column selecting lines becomes shorter, so that the delay of signals in the column selecting lines is prevented and the chip area is reduced. In addition, the longest interconnection out of interconnections between the circuit means and a plurality of row selecting means becomes shorter, so that the delay of signals in the interconnections is prevented. Thus, a semiconductor memory device is obtained which can perform a high-speed operation and has a small chip area.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
a semiconductor chip,
a plurality of first and second memory arrays provided on said semiconductor chip and each comprising a plurality of memory cells arranged in a plurality of rows and columns,
each of said plurality of memory cells being formed of a predetermined layer,
a plurality of first column selecting lines provided corresponding to said plurality of columns and each used for simultaneously selecting corresponding columns in said plurality of first memory arrays,
a plurality of second column selecting lines provided corresponding to said plurality of columns and each used for simultaneously selecting corresponding columns in said plurality of second memory arrays,
each of said first and second columns selecting lines being formed of a layer other than said predetermined layer,
column selecting means formed on said semiconductor chip for selecting any of said plurality of first and second column selecting lines so as to select any of said plurality of columns in said plurality of first and second memory arrays.
a plurality of row selecting means provided corresponding to said plurality of first and second memory arrays on said semiconductor chip for each selecting any one of said plurality of rows in the corresponding memory array,
circuit means providing on said semiconductor chip for driving said column selecting means and said plurality of row selecting means,
one or more pads provided on said semiconductor chip and receiving an externally applied signal or a predetermined potential, and
interconnecting means, including interconnections formed of said other layer, for interconnecting said pad or pads and said circuit means,
said plurality of first memory arrays and said plurality of second memory arrays being arranged in a common column,
said column selecting means and said circuit means being arranged between said plurality of first memory arrays and said plurality of second memory arrays, said plurality of first and second column selecting lines being respectively provided so as to cross said plurality of first and second memory arrays, said interconnections being provided so as to cross said plurality of first memory arrays between said plurality of first column selecting lines and to cross said plurality of second memory arrays between said plurality of second column selecting lines.

2. The semiconductor memory device according to claim 1, which further comprises a plurality of word lines provided corresponding to said plurality of rows and each connected to the plurality of memory cells belonging to the corresponding row, and a plurality of low resistance lines provided in the upper portion of said plurality of word lines in parallel with the word lines, each of said plurality of first and second memory arrays being divided into a plurality of blocks with predetermined spacing so as to partition each of said plurality of word lines at a plurality of points, each of said plurality of lines having low resistance lines being connected to the corresponding word line at said plurality of points.

3. The semiconductor memory device according to claim 2, wherein said interconnections are provided so as to cross said plurality of first or second memory arrays in regions of said predetermined spacing between said plurality of blocks.

4. The semiconductor memory device of claim 1, wherein said semiconductor chip is a rectangular chip;

said column selecting means and said circuit means being arranged in parallel with the short sides of said rectangular chip; and said plurality of first and second column selecting lines being arranged in parallel with the long sides of said rectangular chip.

5. A semiconductor memory device divided into at least two blocks, each block having at least one array of memory cells, said semiconductor memory device comprising word line decoder means, an array of sense amplifiers, input and output means, a column selecting means, and a peripheral circuit means, including at least an address buffer means, connected to said column select means and said word line decoder means, wherein said column selecting means and said peripheral circuit means being interposed between said at least two blocks of said semiconductor memory device whereby lengths of connections of said peripheral circuit means to said column select means and said word line decoder means are reduced, each memory cell array is articulated into groups of memory cells, and said semiconductor memory device is integrated on a semiconductor chip having a plurality of connection pads provided on said chip and openings are provided between said groups of memory cells on said chip, said semiconductor memory device further including a) a shunt connection means for at least one word line, formed in parallel therewith and including periodic connections thereto along the length of said word line and said periodic connections are made between said groups of memory cells, and b) interconnecting means, including at least one interconnection provided along said openings, for interconnecting at least one of said connection pads and at least said peripheral circuit means.

* * * * *